(12) United States Patent
Dahmen et al.

(10) Patent No.: US 10,319,559 B2
(45) Date of Patent: Jun. 11, 2019

(54) METHOD AND DEVICE FOR TESTING SAMPLES BY MEANS OF AN ELECTRON OR ION BEAM MICROSCOPE

(71) Applicants: Tim Dahmen, Saarbrucken (DE); Niels de Jonge, Ingbert (DE)

(72) Inventors: Tim Dahmen, Saarbrucken (DE); Niels de Jonge, Ingbert (DE)

( * ) Notice: Subject to any disclaimer, the term of this patent is extended or adjusted under 35 U.S.C. 154(b) by 0 days.

(21) Appl. No.: 15/257,667

(22) Filed: Sep. 6, 2016

(65) Prior Publication Data

US 2017/0154754 A1    Jun. 1, 2017

(30) Foreign Application Priority Data

Sep. 4, 2015    (DE) ...................... 10 2015 114 843

(51) Int. Cl.
| | |
|---|---|
| *H01J 37/22* | (2006.01) |
| *H01J 37/26* | (2006.01) |
| *H01J 37/28* | (2006.01) |
| *H01J 37/10* | (2006.01) |
| *H01J 37/20* | (2006.01) |

(52) U.S. Cl.
CPC ............ *H01J 37/222* (2013.01); *H01J 37/10* (2013.01); *H01J 37/20* (2013.01); *H01J 37/265* (2013.01); *H01J 37/28* (2013.01); *H01J 2237/2611* (2013.01); *H01J 2237/2802* (2013.01)

(58) Field of Classification Search
CPC .......... H01J 37/10; H01J 37/20; H01J 37/222; H01J 37/28
See application file for complete search history.

(56) References Cited

U.S. PATENT DOCUMENTS

| | | | |
|---|---|---|---|
| 7,253,410 B1* | 8/2007 | Bertsche | H01J 37/026 250/307 |
| 9,697,987 B2* | 7/2017 | Yokosuka | H01J 37/28 |
| 2006/0151700 A1* | 7/2006 | Honda | G01N 23/2251 250/310 |
| 2009/0084954 A1* | 4/2009 | Ezumi | G01N 23/2251 250/307 |
| 2013/0306866 A1* | 11/2013 | Hoque | H01J 37/1474 250/310 |

* cited by examiner

*Primary Examiner* — David E Smith
(74) *Attorney, Agent, or Firm* — Klarquist Sparkman, LLP

(57) ABSTRACT

The disclosed subject matter relates to testing a sample by means of a particle beam microscope in which the sample is scanned in a point-wise manner by a focused beam of charged particles thereby generating imaging signals. The particle beam dose applied per scanning point is changed during scanning.

25 Claims, 2 Drawing Sheets

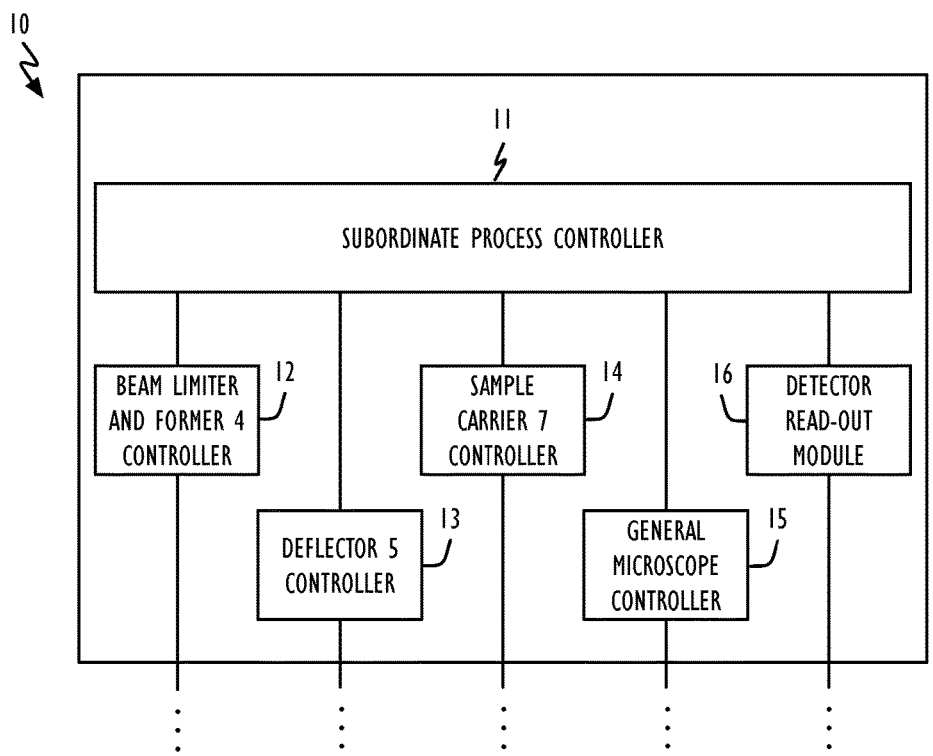
FIG. 2
FIG. 3(A)  FIG. 3(B)
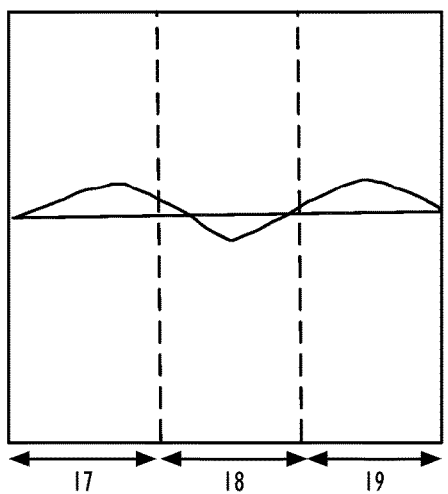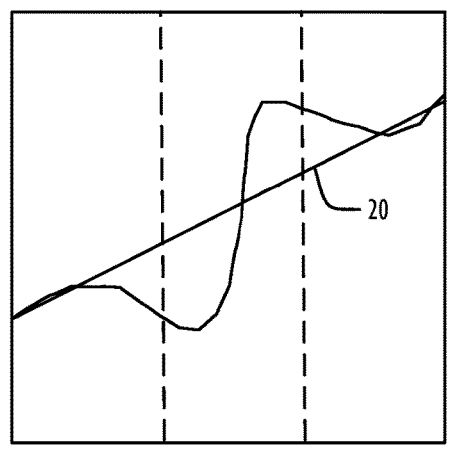

METHOD AND DEVICE FOR TESTING SAMPLES BY MEANS OF AN ELECTRON OR ION BEAM MICROSCOPE

BACKGROUND

The invention relates to a method for testing a sample by means of a particle beam microscope, i.e., an ion or electron beam microscope, in which the sample is scanned in a point-wise manner by a focused beam of charged particles for generating imaging signals. The invention further relates to a device for carrying out the method.

Electron microscopy methods of the above-mentioned kind, in which the sample is scanned by a focused electron beam (called REM (Rasterelektronen-mikroskopie) or SEM (scanning electron microscopy) method), have been used for a long time, e.g., in material research. The scanning method is also used in transmission electron microscopy (TEM) as so-called scanning transmission electron microscopy (STEM), in which the scanning electron beam radiates through the sample. STEM tomography, which uses a focused electron beam, allows larger sample thicknesses as compared to the TEM method. The thickness of a carbon-based sample can be up to some micrometers, in the TEM method only some hundred nanometers. As compared to the TEM method, the STEM method, in which an overall dose that is higher by one to two orders is applied to the sample by the point-wise scanning by the electron beam, is disadvantageous in view of a lower dose efficiency. In STEM tomography, a series of data sets is generated in a very time-consuming manner in that the sample is scanned by means of the electron beam at different inclination angles relative to the focused electron beam in a two-dimensional manner by transmission radiation. On the basis of the data sets, which comprise 3D information, images of the interior of the sample can be reconstructed by using tomographic standard methods. It is also time-consuming to obtain three-dimensional imaging data in the so-called serial section method by means of a scanning electron microscope. For this purpose, the surface of a sample is repeatedly scanned by means of a focused electron beam, and after each scanning process the uppermost layer of the sample is removed by means of an ion beam so that a respective new section surface is formed. Thus, different layer images of the sample, which comprise 3D information, are obtained.

In the method described above, the same electron beam dose is applied in each scanning point during scanning by the focused electron beam. As a result, different loads are applied to the volume elements of the sample. In particular volume elements which lie on the axis about which the sample is rotated for adjusting different inclination angles are irradiated several times, which partly leads to very high loads on the sample. A low dose per scanning point would therefore be desirable, also for reasons of a reduced time necessary for generating the data sets. On the other hand, low doses are an obstacle to a high resolution in 3D reconstruction since the signal-to-noise ratio deteriorates.

SUMMARY

In one embodiment the disclosed concepts provide a method to scan a sample using a charged particle beam in a point-wise manner wherein the particle beam dose applied per scanning point is changed during scanning. By doing this, it is possible to restrict higher dose amounts of the charged particle (e.g., electron) beam to areas of the sample which are of interest; thereby providing a high quality image, lowering the overall dose and the time necessary for detecting the data sets of imaging signals compared to the prior art.

More particularly, the particle beam's dose may be varied so as to increase the dose for previously identified scanning points compared to the particle beam dose applied to scanning points of the environment (i.e., scanning points not previously identified). In one embodiment, the time integral (duration) of the particle beam flow rather than the particle beam flow itself may be changed. (Changes in the particle beam flow could have a negative effect on the quality of the image.) In some embodiments, scanning points whose corresponding imaging signals have a predetermined minimum gradient, i.e., areas in which the imaging signals generated per scanning point contrast at all or to a particular extent, should preferably be considered for pre-selection. It has been determined that by restricting high electron beam doses applied per scanning point to areas of scanning points with contrasting imaging signals highlights boundaries of objects having a high nuclear charge number Z within the sample. High doses lead to an improved signal-to-noise ratio (SNR) and thus to an increased resolution in the boundary region so that the quality of the obtained image increases as a whole. Non-contrasting areas, which are of lower importance for imaging, can thus be irradiated with lower particle beam doses so that the overall dose is advantageously reduced.

In one embodiment, a sample's scanning points may be selected or identified by means of a pre-scan of the sample. During pre-scan operations, the particle beam dose applied per scanning point can be kept low and unchanged for all scanning points. Contrasting scanning point areas can be easily detected on the basis of the imaging signals generated during pre-scanning if the imaging signals detected during pre-scanning are filtered for highlighting the scanning points to be selected or identified. Pre-scanning can then be followed by main-scanning, during which a substantially higher charged particle beam dose can be applied to the selected scanning points while the remaining scanning points are not irradiated by the particle beam or only to a little extent during this main scanning. In addition, imaging signals generated during main scanning operations can be filtered except for the imaging signals belonging to the selected scanning points in order to highlight the latter signals. Imaging signals generated during main scanning operations may be added to the imaging signals generated during pre-scanning. Thus, the dosing made during pre-scanning may also be used for generating the imaging signal. This approach also helps to keep the sample's overall dose low. By way of example, the microscope's focused charged particle beam may be a beam of electrons and may irradiate the sample (STEM). In one such use, the sample may be scanned by means of the focused electron beam in a two-dimensional manner, preferably line by line and column by column. In other embodiments, methods to obtain or generate tomographic three-dimensional (3D) imaging data are described, wherein the sample is may be subjected to pre-scanning and main scanning under different inclination angles relative to the electron beam. By using this approach, the time-consuming detection of tomographic data and the applied overall dose may be kept low while, at the same time, a high imaging quality may be obtained.

BRIEF DESCRIPTION OF THE DRAWINGS

In disclosed subject matter will be further explained on the basis of embodiments and the enclosed drawings relating to these embodiments, wherein the drawings show:

FIG. 2 is a schematic view of a control and evaluating means of the microscope of FIG. 1; and FIGS. 3(A) and 3(B) are illustrations for explaining the filtering used in a method according to one embodiment.

DETAILED DESCRIPTION

Figure 1:
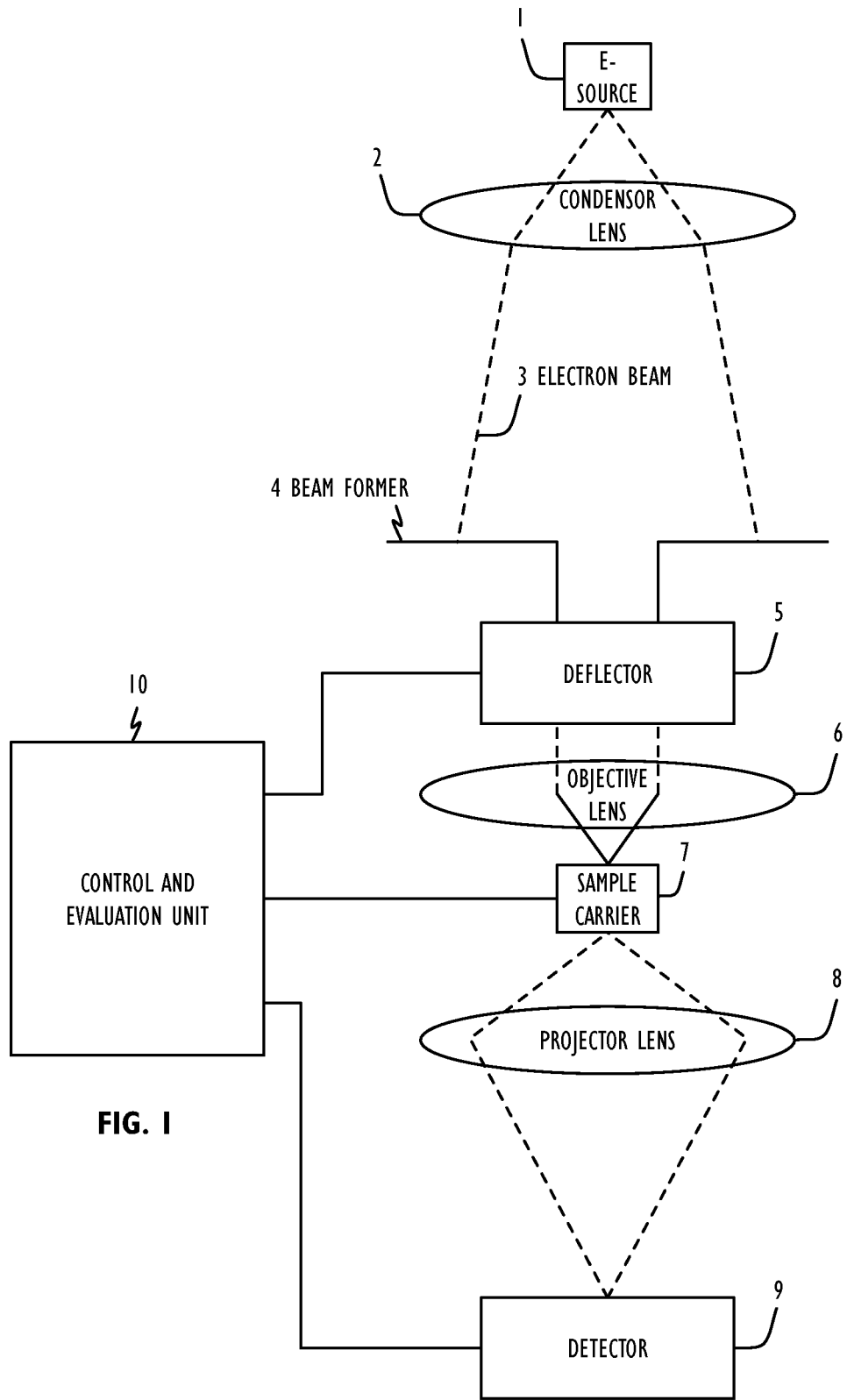
FIG. 1 is a schematic view of a microscope adapted for carrying out a method in accordance with one embodiment.

Referring to FIG. 1, a transmission electron microscope system in accordance with one embodiment comprises an electron source 1, a condenser lens 2 which generates an electron beam 3, a beam limiter and beam former 4, a scanning deflecting means 5, an objective lens 6, a rotatable sample carrier 7, a projector lens 8 and a detector 9. The beam limiter and former 4, the scanning deflecting means 5, the sample carrier 7 and the detector 9 are in connection with a control and evaluating unit 10 of the transmission electron microscope.

Referring to FIG. 2, the control and evaluating unit 10 in accordance with one embodiment comprises, in addition to a subordinate process control means 11 comprising a computer, a separate control means 12 for the beam limiter and former 4, a control means 13 for the deflecting means 5 and a control means 14 for the sample carrier 7. A control means 15 performs general control functions for the transmission electron microscope. The superordinate process control means 11 is further connected to a detector read-out means 16.

Returning to FIG. 1, the electron optics of the shown transmission electron microscope can generate a focused electron beam which is deflected in a parallel manner by the deflecting means 5 for scanning a sample held by the sample carrier 7 so that the electron beam maintains its direction from scanning point to scanning point. Relative to the sample, the irradiation angle of the electron beam can be varied by rotating the sample carrier 7. In the shown example, rotation of the sample carrier about two axes being perpendicular with respect to each other can take place in a respective tilting angle range of 60°.

When the sample is irradiated by the focused electron beam, the detector 9 registers all electrons which hit the detector within a predetermined scattering angle and whose number, if applicable, varies from scanning point to scanning point depending on the local electron density within the sample. The detector signal which is detected per scanning point and which is received, processed to a grayscale value and stored by the process control means 11 changes accordingly.

By means of the transmission electron microscope of FIG. 1, a sample can be tested tomographically in that it is scanned point by point in a two-dimensional manner under different inclination angles relative to the beam direction of the focused electron beam. On the basis of the thus obtained imaging data, which comprise three-dimensional (3D) information, desired images of the inner structure of the sample can be reconstructed tomographically.

The control and evaluating unit 10 of the transmission electron microscope (STEM) shown in FIG. 1 is able to control the electron beam dose applied per scanning point in such a manner that it varies from scanning point to scanning point. For this purpose, the exposure time is changed. When the sample is scanned line by line and column by column, e.g., the exposure time for each scanning point of a line can be stored in a shift register included in the control means 13 and supplied with data by the process control means 11.

In the shown example, the process control means 11 of the control and evaluating means 10 can be programmed such that a desired electron beam dose can be assigned to each scanning point. It is thus possible to carry out tomographic tests of samples in a short time and with a low overall dose of the electron beam applied to the sample, as will be described in the following. For a dose-efficient tomographic testing of a sample, each two-dimensional scanning carried out for different inclination angles of a sample may be preceded by a pre-scanning in which the electron beam dose per scanning point is low and constant for all scanning points. On the basis of the image data detected during pre-scanning, areas of scanning points which are of interest and in which the respective grayscale values change considerably can be detected. For this purpose, the grayscale value data may be appropriately smoothed by a bandpass filter suppressing the highest spatial frequencies and having a window comprising three scanning points 17 to 19, as shown in FIGS. 3a and 3b. In the accordingly smoothed gray image, the addresses of scanning points can be detected in accordance with FIG. 3b with a gradient 20 of the grayscale value different from zero.

In the described example, the respective scanning point addresses may be detected by the process control means 11 which, as a result, may program the shift registers included within the control means 12 in such a manner that in the following main scanning process only the detected scanning points are subjected to a dose that is substantially increased as compared to pre-scanning, while all other scanning points are not further irradiated by the focused electron beam. The grayscale values detected during main scanning may be added to the grayscale values detected during pre-scanning. In the illustrations, the areas of interest and having an increased contrast, i.e., the boundaries of the objects, are highlighted by the increased dose during main scanning in that the increased dose improves the signal-to-noise ratio and thus the resolution. In order to further stress the visual highlighting and to allow the image to be evaluated automatically, the areas which are not highlighted and to which no dose has been applied during the second (main) scanning process may be appropriately smoothed once again, wherein smoothing can be performed, e.g., by a Gaussian filter in order to achieve an even more extensive smoothing than after pre-scanning.

The invention claimed is:

1. A method for testing a sample, comprising:
   identifying a set of first sample points;
   impinging a focused beam of charged particles on the first sample points at a first dose level;
   detecting a set of first signal intensities induced by the impact of the focused beam of charged particles on the first sample points;
   from the set of first sample points, selecting a set of second sample points based on the first signal intensities;
   impinging the focused beam of charged particles on the second sample points at a second dose level; and
   detecting a set of second signal intensities induced by the impact of the focused beam of charged particles on the second sample points;
   wherein the second sample points correspond to first sample points having signal intensities that exhibit a gradient having a magnitude greater than a predetermined minimum gradient.

2. The method of claim 1, wherein the first dose level is higher than the second dose level.

3. The method of claim 1, further comprising generating an image based on the set of second signal intensities.

4. The method of claim 3, wherein the generated image is based on a combination of the first signal intensities and the second signal intensities.

5. The method of claim 1, wherein the first sample points and the second sample points are situated on a two-dimensional grid on the surface of the sample.

6. The method of claim 1, wherein the focused beam of charged particles comprises a focused beam of electrons.

7. The method of claim 1, wherein an inclination angle of the sample relative to the beam of charged particles is different at the first sample points than an inclination angle of the sample relative to the focused beam of charged particles at the second sample points.

8. The method of claim 1, further comprising:
from the set of first sample points, selecting a set of third sample points based on the first signal intensities;
impinging the focused beam of charged particles on the third sample points at a third dose level; and
detecting a set of third signal intensities induced by the impact of the focused beam of charged particles on the third sample points.

9. The method of claim 8, further comprising generating an image based on a combination of the first signal intensities, the second signal intensities, and the third signal intensities.

10. The method of claim 8, wherein selecting the set of third sample points comprises selecting sample points of the first set of sample points having a gradient of first signal intensities below a predetermined gradient.

11. The method of claim 1, wherein selecting the set of second sample points comprises selecting first sample points based on gradients of the first signal intensities.

12. A charged particle beam microscope, comprising:
a lens system configured to focus a charged particle beam onto a sample; and
one or more control units programmed to:
identify a first set of sample points, each of the first set of sample points corresponding to first points on a surface of a sample;
impinge the focused charged particle beam on the sample points of the first set of sample points at a first dose level;
detect first signal intensities induced by the impact of the focused charged particle beam on the sample points of the first set of sample points;
from the first set of sample points, select a second set of sample points based on the first signal intensities;
impinge the focused charged particle beam on the sample points of the second set of sample points at a second dose level, wherein the first and second dose levels are different; and
detect second signal intensities induced by the impact of the focused charged particle beam on the sample points of the second set of sample points,
wherein the second set of sample points corresponds to sample points whose detected signal intensities exhibit at least a minimum gradient.

13. The charged particle beam microscope of claim 12, wherein the second dose level is higher than the first dose level.

14. The charged particle beam microscope of claim-12, wherein the one or more control units are further programmed to generate an image based on the second signal intensities induced by the impact of the focused charged particle beam on the sample points of the second set of sample points.

15. The charged particle beam microscope of claim 12, wherein the one or more control units are further programmed to generate an image based on a combination of the first signal intensities and the second signal intensities.

16. The charged particle beam microscope of claim 12, wherein the source of charged particles is an electron source.

17. The charged particle beam microscope of claim 12, wherein the one or more control units are further programmed to:
from the set of first set of sample points, select a set of third set of sample points having a gradient of first signal intensities below a predetermined gradient;
impinge the focused charged particle beam on the sample points of the third set of sample points at a third dose level; and
detect third signal intensities induced by the impact of the focused charged particle beam on the sample points of the third set of sample points.

18. The charged particle beam microscope of claim 17, wherein the one or more control units are further programmed to generate an image based on a combination of the first signal intensities, the second signal intensities, and the third signal intensities.

19. The charged particle beam microscope of claim 12, wherein selecting the set of second sample points comprises selecting first sample points having a gradient of first signal intensities at least at a predetermined gradient.

20. A method for testing a sample comprising:
identifying a set of first sample points;
impinging a focused beam of charged particles on the first sample points at a first dose level;
detecting a set of first signal intensities induced by the impact of the focused beam of charged particles on the first sample points;
from the set of first sample points, selecting a set of second sample points based on the first signal intensities;
impinging the focused beam of charged particles on the second sample points at a second dose level; and
detecting a set of second signal intensities induced by the impact of the focused beam of charged particles on the second sample points;
wherein an inclination angle of the sample relative to the beam of charged particles is different at the first sample points than an inclination angle of the sample relative to the focused beam of charged particles at the second sample points.

21. A method for testing a sample, comprising:
identifying a set of first sample points;
impinging a focused beam of charged particles on the first sample points at a first dose level;
detecting a set of first signal intensities induced by the impact of the focused beam of charged particles on the first sample points;
from the set of first sample points, selecting a set of second sample points based on the first signal intensities;
impinging the focused beam of charged particles on the second sample points at a second dose level;
detecting a set of second signal intensities induced by the impact of the focused beam of charged particles on the second sample points; and generating an image based on the set of second signal intensities, wherein the generated image is based on a combination of the first signal intensities and the second signal intensities.

22. A method for testing a sample, comprising:
identifying a set of first sample points;
impinging a focused beam of charged particles on the first sample points at a first dose level;
detecting a set of first signal intensities induced by the impact of the focused beam of charged particles on the first sample points;
from the set of first sample points, selecting a set of second sample points based on the first signal intensities;
impinging the focused beam of charged particles on the second sample points at a second dose level;
detecting a set of second signal intensities induced by the impact of the focused beam of charged particles on the second sample points, wherein the first sample points and the second sample points are situated on a two-dimensional grid on the surface of the sample.

23. A method for testing a sample, comprising:
identifying a set of first sample points;
impinging a focused beam of charged particles on the first sample points at a first dose level;
detecting a set of first signal intensities induced by the impact of the focused beam of charged particles on the first sample points;
from the set of first sample points, selecting a set of second sample points based on the first signal intensities;
impinging the focused beam of charged particles on the second sample points at a second dose level;
detecting a set of second signal intensities induced by the impact of the focused beam of charged particles on the second sample points, wherein an inclination angle of the sample relative to the beam of charged particles is different at the first sample points than an inclination angle of the sample relative to the focused beam of charged particles at the second sample points.

24. A charged particle beam microscope, comprising:
a lens system configured to focus a charged particle beam onto a sample; and
one or more control units programmed to:
identify a first set of sample points, each of the first set of sample points corresponding to first points on a surface of a sample;
impinge the focused charged particle beam on the sample points of the first set of sample points at a first dose level;
detect first signal intensities induced by the impact of the focused charged particle beam on the sample points of the first set of sample points;
from the first set of sample points, select a second set of sample points based on the first signal intensities;
impinge the focused charged particle beam on the sample points of the second set of sample points at a second dose level, wherein the first and second dose levels are different;
detect second signal intensities induced by the impact of the focused charged particle beam on the sample points of the second set of sample points, and
generate an image based on a combination of the first signal intensities and the second signal intensities.

25. A charged particle beam microscope, comprising:
a lens system configured to focus a charged particle beam onto a sample; and
one or more control units programmed to:
identify a first set of sample points, each of the first set of sample points corresponding to first points on a surface of a sample;
impinge the focused charged particle beam on the sample points of the first set of sample points at a first dose level;
detect first signal intensities induced by the impact of the focused charged particle beam on the sample points of the first set of sample points;
from the first set of sample points, select a second set of sample points based on the first signal intensities;
impinge the focused charged particle beam on the sample points of the second set of sample points at a second dose level, wherein the first and second dose levels are different;
detect second signal intensities induced by the impact of the focused charged particle beam on the sample points of the second set of sample points from the set of first set of sample points;
select a set of third set of sample points having a gradient of first signal intensities below a predetermined gradient;
impinge the focused charged particle beam on the sample points of the third set of sample points at a third dose level; and
detect third signal intensities induced by the impact of the focused charged particle beam on the sample points of the third set of sample points.

* * * * *